United States Patent
Tachi et al.

(10) Patent No.: US 12,156,393 B2
(45) Date of Patent: Nov. 26, 2024

(54) WIRE HARNESS

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Kentaro Tachi, Yokohama (JP); Daisuke Hashimoto, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 100 days.

(21) Appl. No.: 17/915,133

(22) PCT Filed: Mar. 24, 2021

(86) PCT No.: PCT/JP2021/012215
§ 371 (c)(1),
(2) Date: Sep. 28, 2022

(87) PCT Pub. No.: WO2021/210363
PCT Pub. Date: Oct. 21, 2021

(65) Prior Publication Data
US 2023/0164965 A1    May 25, 2023

(30) Foreign Application Priority Data

Apr. 15, 2020  (JP) .................................. 2020-072896

(51) Int. Cl.
B60R 16/02    (2006.01)
H01B 7/00    (2006.01)
H05K 9/00    (2006.01)

(52) U.S. Cl.
CPC ....... *H05K 9/0098* (2013.01); *B60R 16/0215* (2013.01); *H01B 7/0009* (2013.01); *H01B 7/0045* (2013.01)

(58) Field of Classification Search
CPC .......................... B60R 6/0207; B60R 6/0215
See application file for complete search history.

(56) References Cited

U.S. PATENT DOCUMENTS

| 2,211,584 A | * | 8/1940 | Ruben ................. H01B 11/1817 336/84 R |
| 2013/0192890 A1 | | 8/2013 | Adachi et al. |

(Continued)

FOREIGN PATENT DOCUMENTS

| JP | H06-119824 A | 4/1994 |
| JP | 2005-44607 A | 2/2005 |
| JP | 2012-169215 A | 9/2012 |

OTHER PUBLICATIONS

Jun. 8, 2021 International Search Report issued in International Patent Application No. PCT/JP2021/012215.

*Primary Examiner* — Paresh Paghadal
(74) *Attorney, Agent, or Firm* — Oliff PLC

(57) ABSTRACT

A wire harness including: a shielded wire having a core wire; an insulating cover covering an outer surface of the core wire; and an electromagnetic shield covering the insulating cover, wherein the electromagnetic shield is a metal layer that is seamlessly formed in intimate contact with an outer surface of the insulating cover.

4 Claims, 2 Drawing Sheets

(56) References Cited

U.S. PATENT DOCUMENTS

| | | | |
|---|---|---|---|
| 2013/0248246 A1* | 9/2013 | Oga | H02G 3/0462 |
| | | | 174/72 A |
| 2015/0107871 A1* | 4/2015 | Adachi | H01B 7/0045 |
| | | | 174/102 C |
| 2016/0064120 A1 | 3/2016 | Wakabayashi et al. | |
| 2018/0001849 A1* | 1/2018 | Abe | B60R 16/023 |
| 2018/0233893 A1* | 8/2018 | Adachi | H01B 7/18 |
| 2019/0126860 A1* | 5/2019 | Takamatsu | B60R 16/0207 |
| 2020/0258657 A1* | 8/2020 | Nakai | H05K 9/00 |

* cited by examiner

WIRE HARNESS

BACKGROUND

The present disclosure relates to a wire harness.

Conventionally, wire harnesses used for vehicles such as hybrid cars and electric automobiles are routed under the floor of vehicles or the like in some cases. Further, there are cases where such a wire harness includes a plurality of wires and a metal outer cover member that is configured to individually accommodate these wires and serves as a plurality of electromagnetic shielding members, for example (e.g., see JP 2005-44607A). With such a wire harness, it is possible to obtain a high electromagnetic shielding effect due to the metal outer cover member.

SUMMARY

However, the above-described wire harness is problematic in that the wire harness has a large overall cross-sectional area in a direction that is orthogonal to the direction in which the wire harness extends because the wires are accommodated with gaps interposed between the outer cover member and the wires, for example. Also, even when a braided member obtained by braiding metal wires is adopted as an electromagnetic shielding member and fitted around the wires, instead of the metal outer cover member, gaps are present between metal wires constituting the braided member. Thus, such a configuration is problematic in that the thickness thereof increases when attempts are made to ensure a high electromagnetic shielding effect, resulting an increase in the overall cross-sectional area in the direction orthogonal to the direction in which the wire harness extends.

An exemplary aspect of the disclosure provides a wire harness that can achieve a size reduction and ensure a high electromagnetic shielding effect.

A wire harness according to this disclosure includes a shielded wire having a core wire, an insulating cover covering an outer surface of the core wire, and an electromagnetic shield covering the insulating cover, in which the electromagnetic shield is a metal layer that is seamlessly formed in intimate contact with an outer surface of the insulating cover.

According to the wire harness of this disclosure, it is possible to achieve a size reduction and ensure a high electromagnetic shielding effect.

DETAILED DESCRIPTION OF EMBODIMENTS

Description of Embodiments of the Present Disclosure

First, embodiments of this disclosure will be listed and described below.

A wire harness according to this disclosure is (1) a wire harness including a shielded wire having a core wire, an insulating cover covering an outer surface of the core wire, and an electromagnetic shielding member covering the insulating cover, in which the electromagnetic shielding member is a metal layer that is seamlessly formed in intimate contact with an outer surface of the insulating cover.

According to this configuration, because the electromagnetic shielding member is a metal layer that is seamlessly formed in intimate contact with the outer surface of the insulating cover, it is possible to ensure a higher electromagnetic shielding effect while reducing the cross-sectional area in a direction orthogonal to a direction in which the electromagnetic shielding member extends, compared to a case where the electromagnetic shielding member is a metal outer cover member, a metal braided member, or the like, for example.

(2) It is preferable that the wire harness further includes a metal member connected to the shielded wire, in which the metal layer is formed over the metal member.

According to this configuration, because the metal layer is formed over the metal member connected to the shielded wire, it is possible to connect the metal layer to the metal member without using an additional connecting component such as a crimping band, and to establish an electromagnetic shield structure, for example.

(3) It is preferable that the insulating cover is made of enamel.

According to this configuration, because the insulating cover is made of enamel, higher heat resistance can be achieved, compared to a case where another ordinary insulating cover is used. Therefore, a manufacturing method with which a metal layer is formed by spraying heated metal powder onto the outer surface of the insulating cover can be easily adopted.

(4) It is preferable that the core wire is constituted by a bus bar.

According to this configuration, because the core wire is constituted by a bus bar, the enamel does not permeate through the core wire when forming the insulating cover made of enamel. That is, if the core wire is constituted by a twisted wire, the enamel may permeate through the core wire when forming the insulating cover made of enamel. However, this situation can be avoided.

DETAILS OF EMBODIMENTS OF THE PRESENT DISCLOSURE

Specific examples of the wire harness of this disclosure will be described below with reference to the drawings. Note that the present disclosure is not limited to these examples, but is indicated by the claims, and changes that come within the meaning and range of equivalency of the claims are intended to be embraced therein.

Figure 1:
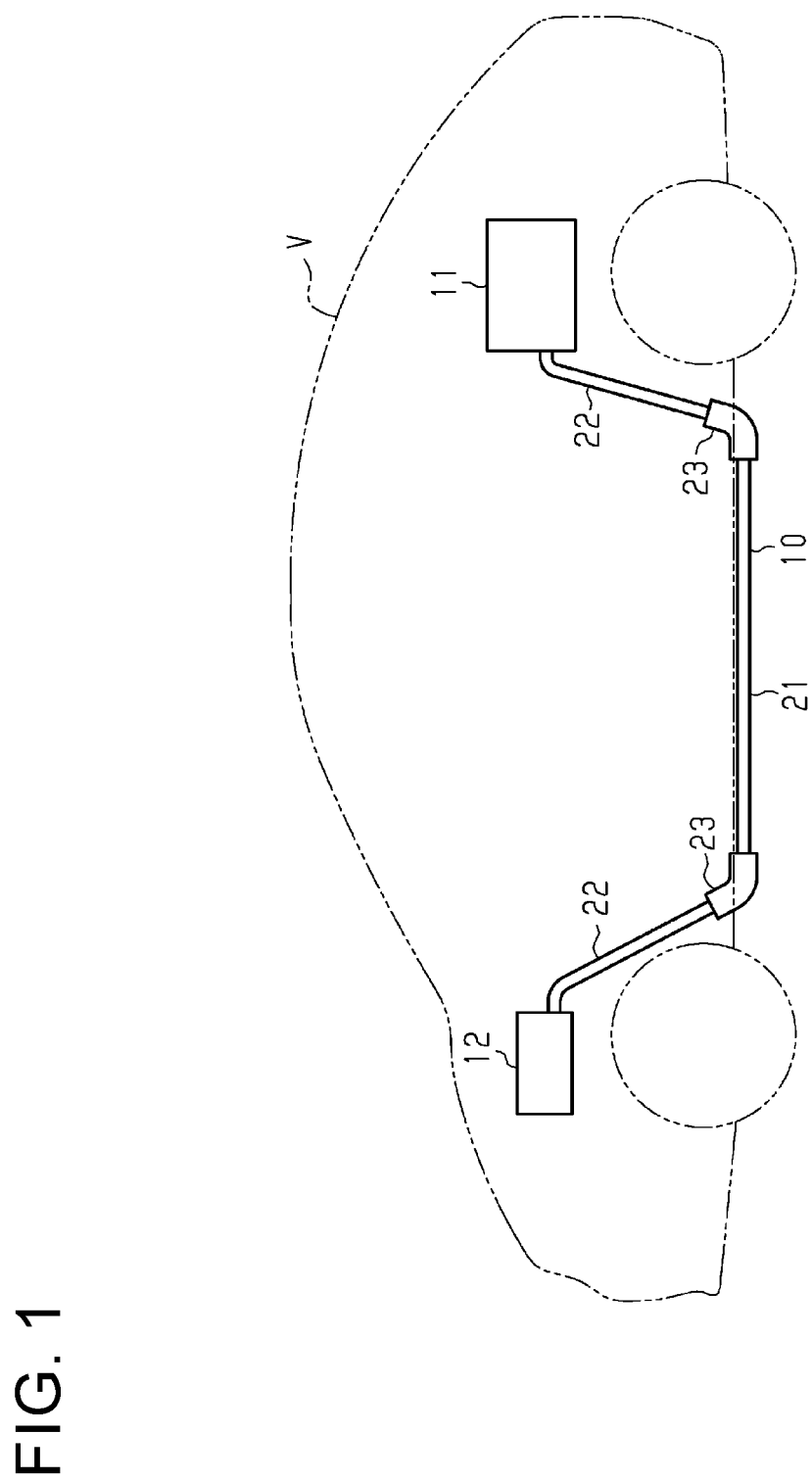
FIG. 1 is a schematic diagram of a vehicle in one embodiment.

As shown in FIG. 1, a wire harness 10 electrically connects two electrical apparatuses (devices), or three or more electrical apparatuses (devices). The wire harness 10 electrically connects a battery 11 disposed in a rear portion of a vehicle V and an electrical component 12 disposed in a front portion of the vehicle V, for example. Note that high-voltage batteries that can supply a voltage of 100 volts or more, or low-voltage batteries that can supply a voltage of 1.2 volt, 24 volt, or the like can be adopted as the battery 11. Further, if a high-voltage battery 11 is adopted, an inverter connected to a motor for driving wheels or the like can be adopted as the electrical component 12, for example. Also, if a low-voltage battery 11 is adopted, a distribution board box connected to small motors or the like can be adopted as the electrical component 12, for example. In this embodiment, a case where a high-voltage battery 11 is adopted and a wire harness 10 that handles large currents is adopted will be described. The wire harness 10 is routed such that the central portion thereof extends under the floor of the vehicle V or the like, and two ends thereof extend upward from below the floor and are connected to the battery 11 and the electrical component 12 that are provided on the floor.

The wire harness 10 includes a central wire harness 21 constituting wiring located at the central portion under the floor, end wire harnesses 22 each constituting wiring at two end portions, and connection members 23 serving as metal members for connection the central wire harness 21 and the end wire harnesses 22.

Figure 2:
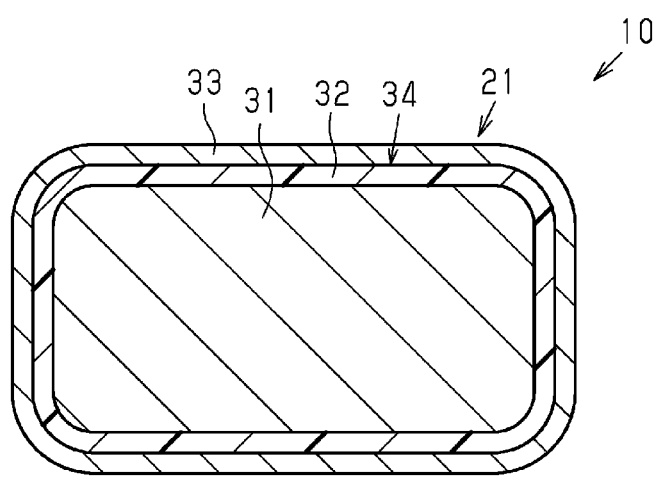
FIG. 2 is a cross-sectional view of a wire harness in one embodiment.

As shown in FIG. 2, the central wire harness 21 includes a core wire 31 and an insulating cover 32 covering an outer surface of the core wire 31, The core wire 31 is constituted by a bar-shaped bus bar made of a metal such as aluminum or copper. The shape of a cross-section of the core wire 31 in this embodiment that is orthogonal to the direction in which the core wire 31 extends is a rectangle, and the core wire 31 is arranged such that the length in the width direction of the vehicle V is larger than the length in the up-dawn direction thereof. The insulating cover 32 is made of enamel.

Also, the central wire harness 21 is a shielded wire having a metal layer 33 serving as an electromagnetic shielding member (electromagnetic shield) covering the insulating cover 32, The metal layer 33 is seamlessly formed in intimate contact with the outer surface of the insulating cover 32. Specifically, the metal layer 33 is provided so as to cover the entire outer peripheral surface of the insulating cover 32, but does not have a seam as if a metal foil is bonded. Also, the metal layer 33 has no seams such as that in a braided member obtained by braiding metal wires, and has no gaps resulting from the formation of a seam. This metal layer 33 is formed by spraying heated metal powder onto the outer surface of the insulating cover 32.

Figure 3:
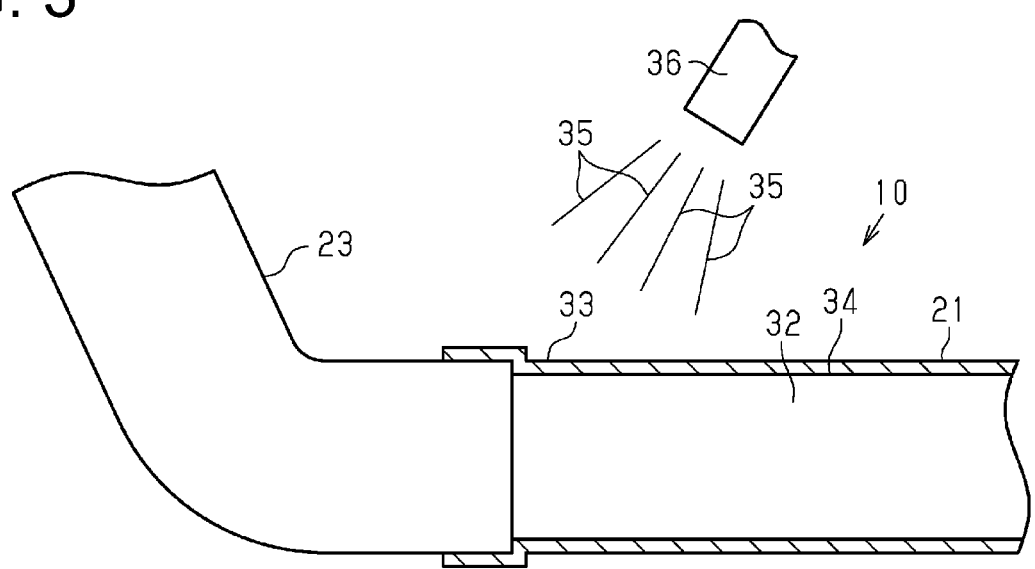
FIG. 3 is an enlarged schematic view of a wire harness in one embodiment.

Also, as shown in FIG. 3, the metal layer 33 is formed over the connection member 23. That is, the metal layer 33 is formed as a single body from the outer surface of the insulating cover 32 to the outer surface of the connection member 23 in a state where a wire 34 constituted by a core wire 31 and the insulating cover 32 is connected to the connection member 23.

Next, a method for manufacturing the wire harness 10 configured as above and the effects thereof will be described.

The method for manufacturing the wire harness 10 includes a connecting step of connecting the wire 34 constituted by the core wire 31 and the insulating cover 32 in the central wire harness 21 to the connection member 23, and a forming step of forming the metal layer 33 by spraying heated metal powder 35 onto the outer surface of the insulating cover 32 after the connecting step.

Specifically, as shown in FIG. 3, in the forming step, the metal layer 33, which extends from the outer surface of the insulating cover 32 to the outer surface of the connection member 23 and which is in intimate contact with these outer surfaces without a seam, is formed by spraying, from a nozzle 36, the heated metal powder 35 onto the outer surface of the insulating cover 32 and the outer surface of the connection member 23. This results in a state which the outer side of the wire 34 that includes the core wire 31 is surrounded by the metal layer 33, and the metal layer 33 is electrically connected to the connection member 23, which is a metal member. Thus, emission of electromagnetic noise from the core wire 31 to the outside is suppressed.

Next, the effects of the above embodiment will be described below.

(1) Because the electromagnetic shielding member is the metal layer 33 that is seamlessly formed in intimate contact with the outer surface of the insulating cover 32, it is possible to ensure a higher electromagnetic shielding effect while reducing the cross-sectional area in a direction orthogonal to a direction in which the electromagnetic shielding member extends, compared to a case where the electromagnetic shielding member is a metal outer cover member, a metal braided member, or the like, for example.

(2) Because the metal layer 33 is formed over the connection member 23 connected to the central wire harness 21, it is possible to connect the metal layer 33 to the connection member 23, which is a metal member, without using an additional connecting component such as a crimping band, and to establish an electromagnetic shield structure, for example. That is, when a braided member is adopted as an electromagnetic shielding member, for example, the braided member needs to be disposed outside the metal member and connected thereto by fastening them together using a crimping band or the like. However, this need is eliminated.

(3) Because the insulating cover 32 is made of enamel, higher heat resistance can be achieved, compared to a case where another ordinary insulating cover is used. Therefore, a manufacturing method with which the metal layer 33 is formed by spraying the heated metal powder 35 onto the outer surface of the insulating cover 32 can be easily adopted. In other words, because the insulating cover 32 is made of highly heat resistant enamel in order to form the metal layer 33 by spraying the heated metal powder 35 onto the outer surface of the insulating cover 32, the metal layer 33 can be easily manufactured, in addition to having the above-described effects.

(4) Because the core wire 31 is constituted by a bus bar, the enamel does not permeate through the core wire when forming the insulating cover 32 made of enamel. That is, if the core wire 31 is constituted by a twisted wire, the enamel may permeate through the core wire when forming the insulating cover 32 made of enamel. However, this situation can be avoided.

(5) Because the method for manufacturing the wire harness 10 includes the forming step of forming the metal layer 33 by spraying the heated metal powder 35 onto the outer surface of the insulating cover 32, the wire harness 10 can be more easily manufactured, compared to a case where an electromagnetic shielding member is separately manufactured and attached to a wire, for example.

This embodiment can be modified and implemented as follows. This embodiment and the following modifications may be combined to the extent that they do not contradict each other technically Although the metal layer 33 is formed over the connection member 23 connected to the central wire harness 21 in the embodiment, the present disclosure is not limited to this. A configuration may be adopted in which the metal layer 33 is not formed over the connection member 23 and is connected to a connection member with another configuration, for example.

Although the insulating cover 32 is made of enamel in the embodiment, the present disclosure is not limited to this, and the insulating cover 32 may be an insulating cover made of another material.

Although the core wire 31 is constituted by a bus bar in the embodiment, the present disclosure is not limited to this, and the core wire 31 may be another type of core wire such as a core wire constituted by a twisted wire, for example.

Although not particularly mentioned in the above embodiment, a pair of the wire harnesses 10 may be arranged side-by-side in one vehicle V, or three or more wire harnesses 10 may be arranged side-by-side, for example.

Although not particularly mentioned in the above embodiment, the central wire harness 21 may be fixed to the vehicle V in a state in which the central wire harness 21 is accommodated in and held by a resin outer cover member that covers and holds the metal layer 33, for example.

Although the wire harness 10 can handle large currents in the embodiment when a high-voltage battery 11 is adopted, the present disclosure is not limited to this and the wire harness 10 may be used as a wire harness to be used when a low-voltage battery 11 is adopted.

The technical ideas that can be grasped based on the embodiment and other examples will be described below together with the effects thereof.

(A) A method for manufacturing a wire harness provided with a shielded wire having a core wire, an insulating cover covering an outer surface of the core wire, and an electromagnetic shielding member covering the insulating cover, the electromagnetic shielding member being a metal layer that is seamlessly formed in intimate contact with an outer surface of the insulating cover, the method including a forming step of forming the metal layer by spraying heated metal powder onto the outer surface of the insulating cover.

According to this method, because the electromagnetic shielding member is a metal layer that is seamlessly formed in intimate contact with the outer surface of the insulating cover, it is possible to ensure a higher electromagnetic shielding effect while reducing the cross-sectional area in a direction orthogonal to a direction in which the electromagnetic shielding member extends, compared to a case where the electromagnetic shielding member is a metal outer cover member, a metal braided member, or the like, for example. Also, because the manufacturing method includes the forming step of forming the metal layer by spraying the heated metal powder onto the outer surface of the insulating cover, the wire harness can be more easily manufactured, compared to a case where an electromagnetic shielding member is separately manufactured and attached to a wire, for example.

The wire harness 10 may have a flat shape having a smaller dimension in the thickness direction thereof than the dimension in the width direction thereof, for example. As in the example shown in FIG. 2, the core wire 31 of the wire harness 10 may be a bus bar having a flat shape with a smaller dimension in the thickness direction thereof than the dimension in the width direction thereof, for example. The core wire 31 has a flat upper surface, a flat lower surface, and two opposing side surfaces, and a cross-section extending in the direction that is orthogonal to the direction in which the core wire 31 extends may be a rectangle. The outer surface of the core wire 31 may be provided with an insulating coating film 32 that has a uniform thickness and is in intimate contact with the core wire 31 so as to cover the entire outer surface thereof. The insulating coating film 32 may be enamel that adheres to the surface of the core wire 31 without permeating through the core wire 31. The outer surface of the insulating coating film 32 may be provided with the metal layer 33 that has a uniform thickness and is in intimate contact with the insulating coating film 32 so as to cover the entire outer surface thereof. The metal layer 33 may be an electromagnetic shielding member of the wire harness 10. The metal layer 33 (electromagnetic shielding member) may be provided so as to have the same shape as the shape of the outer surface of the core wire 31, and the shape of the metal layer 33 in the example shown in FIG. 2 is a rectangular cylinder having a fixed shape over the entire length of the central wire harness 21.

The metal layer 33 may be formed in a state in which the wire 34 in which the insulating coating film 32 is adhered to the core wire 31 and the connection member 23 are connected to each other. The metal layer 33 may also be integrally formed in intimate contact with the outer surface of the insulating coating film 32 and the outer surface of the connection member 23. As shown in FIG. 3, for example, a level difference or a gap extending in a radial direction may form between the outer surface of an end portion of the connection member 23 and the outer surface of the wire 34. However, because the metal layer 33 is formed by spraying, from the nozzle 36, the heated metal powder 35 onto the outer surface of the insulating cover 32 and the outer surface of the connection member 23, the metal layer 33 may be seamlessly formed to have a substantially constant thickness over the connection portion having such a level difference.

The metal layer 33 shown in the illustrated example may be referred to as a seamless and slitless metal layer that continuously extends over the entire length of the metal layer 33 and over the entire periphery of the metal layer 33.

As shown in the example in FIG. 2, the central wire harness 21 may be an insulating resin enamel bus bar such as a polyurethane enamel copper bus bar, for example.

The invention claimed is:

1. A wire harness comprising:
a shielded wire having a core wire;
an insulating cover covering an outer surface of the core wire;
an electromagnetic shield covering the insulating cover; and
a metal body connected to the shielded wire,
wherein the electromagnetic shield is a metal layer that is seamlessly formed in intimate contact with an outer surface of the insulating cover,
wherein the metal layer has a first diameter over the metal body, the first diameter being greater than a second diameter of the metal layer over the core wire, and
wherein the metal layer is an outermost layer over the metal body.

2. The wire harness according to claim 1,
wherein the insulating cover is made of enamel.

3. The wire harness according to claim 2,
wherein the core wire is formed by a bus bar.

4. The wire harness according to claim 1, wherein:
the core wire has a rectangular cross section, a length of the cross section in a width direction being longer than a length of the cross section in an up/down direction, the metal body has a bend, a first portion of the metal body having an first axis that extends from the bend toward the core wire, a second portion of the metal body having an axis that extends upward from the bend in a direction crossing the first axis, wherein the metal layer has an end between the core wire and the bend.

* * * * *